(12) United States Patent
Tanaka

(10) Patent No.: US 7,239,051 B2
(45) Date of Patent: Jul. 3, 2007

(54) DRIVING APPARATUS AND EXPOSURE APPARATUS

(75) Inventor: Hideo Tanaka, Ustunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 112 days.

(21) Appl. No.: 11/074,710

(22) Filed: Mar. 9, 2005

(65) Prior Publication Data
US 2005/0200828 A1  Sep. 15, 2005

(30) Foreign Application Priority Data
Mar. 15, 2004  (JP) .............................. 2004-073403

(51) Int. Cl.
*H02K 41/00*  (2006.01)
*G03B 27/52*  (2006.01)
*G03B 27/58*  (2006.01)
(52) U.S. Cl. .............................. 310/12; 355/30; 355/72
(58) Field of Classification Search ............ 355/72–76; 310/10, 12; 318/359; 378/34, 35
See application file for complete search history.

(56) References Cited

U.S. PATENT DOCUMENTS

| 5,998,890 | A | 12/1999 | Sedgewick et al. ............ 310/12 |
| 6,864,602 | B2 | 3/2005 | Korenaga ..................... 310/12 |
| 2003/0040831 | A1 | 2/2003 | Tanaka et al. ............... 700/121 |
| 2003/0102723 | A1 | 6/2003 | Korenaga ..................... 310/12 |

FOREIGN PATENT DOCUMENTS

JP      2003-116260       4/2003

*Primary Examiner*—W. B. Perkey
*Assistant Examiner*—Marissa A. Ohira
(74) *Attorney, Agent, or Firm*—Fitzpatrick, Cella, Harper & Scinto

(57) ABSTRACT

A driving apparatus which drives an object. The apparatus includes an electromagnetic actuator having a movable element and a stator, a surrounding member surrounding a heat portion of the electromagnetic actuator, a beam which provides the object with a driving force in accordance with movement of the movable element, a connecting member connecting the movable element and the beam, wherein the surrounding member has an opening allowing the movement of the movable element, the opening being arranged at a portion of the surrounding member not facing the object, and a heat recovery unit arranged at a position facing the opening.

11 Claims, 11 Drawing Sheets

FIG. 7
PRIOR ART
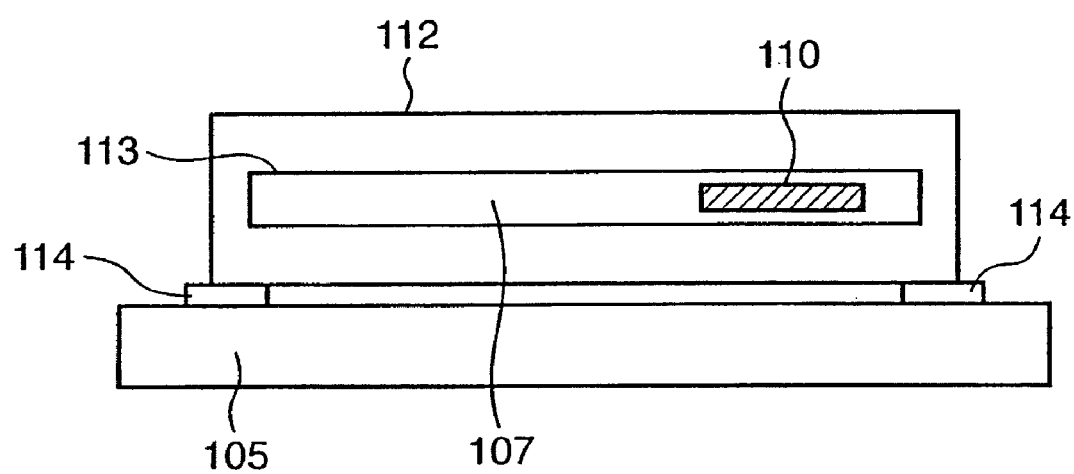
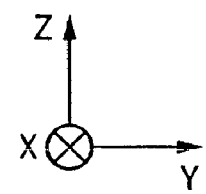

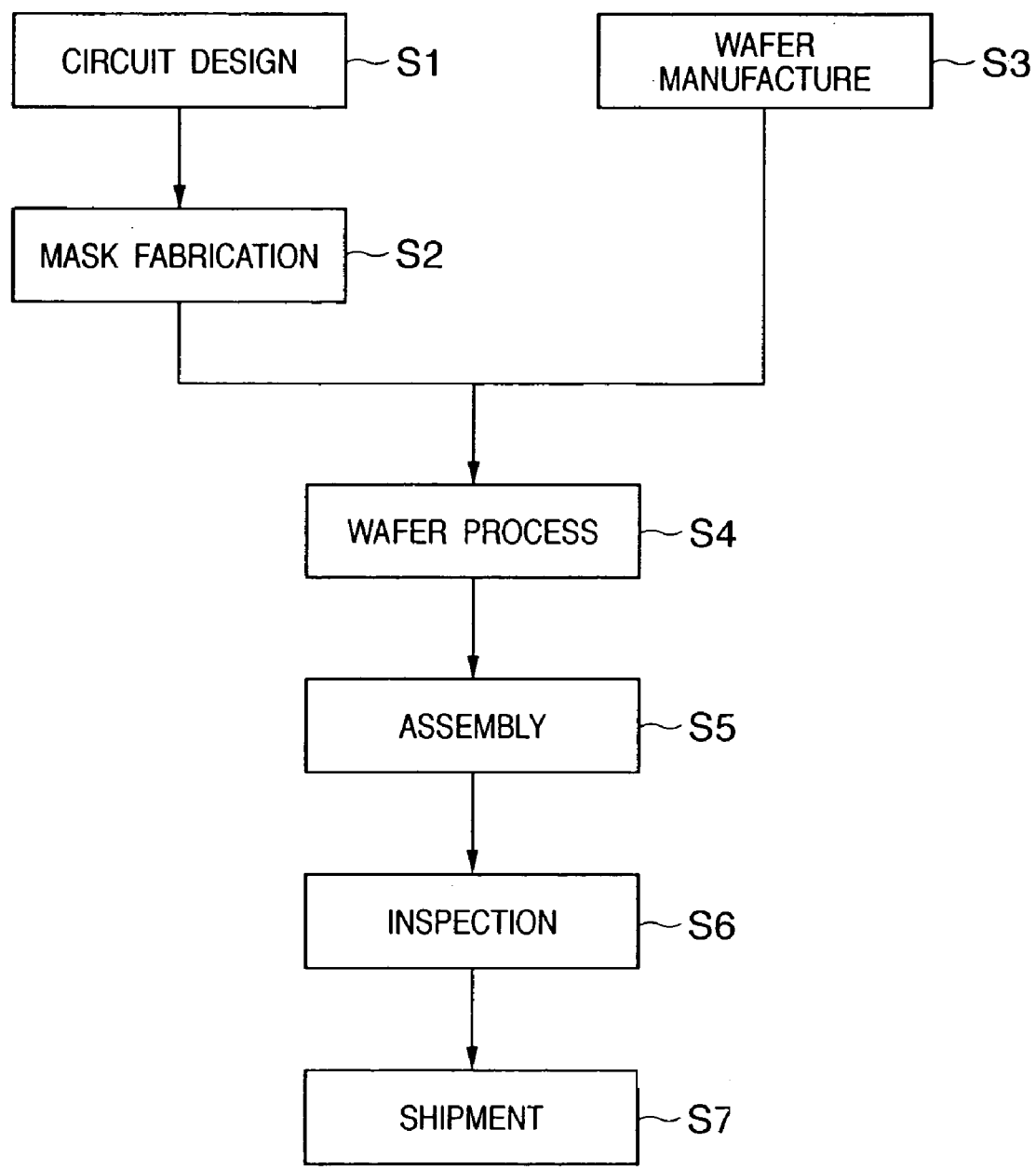

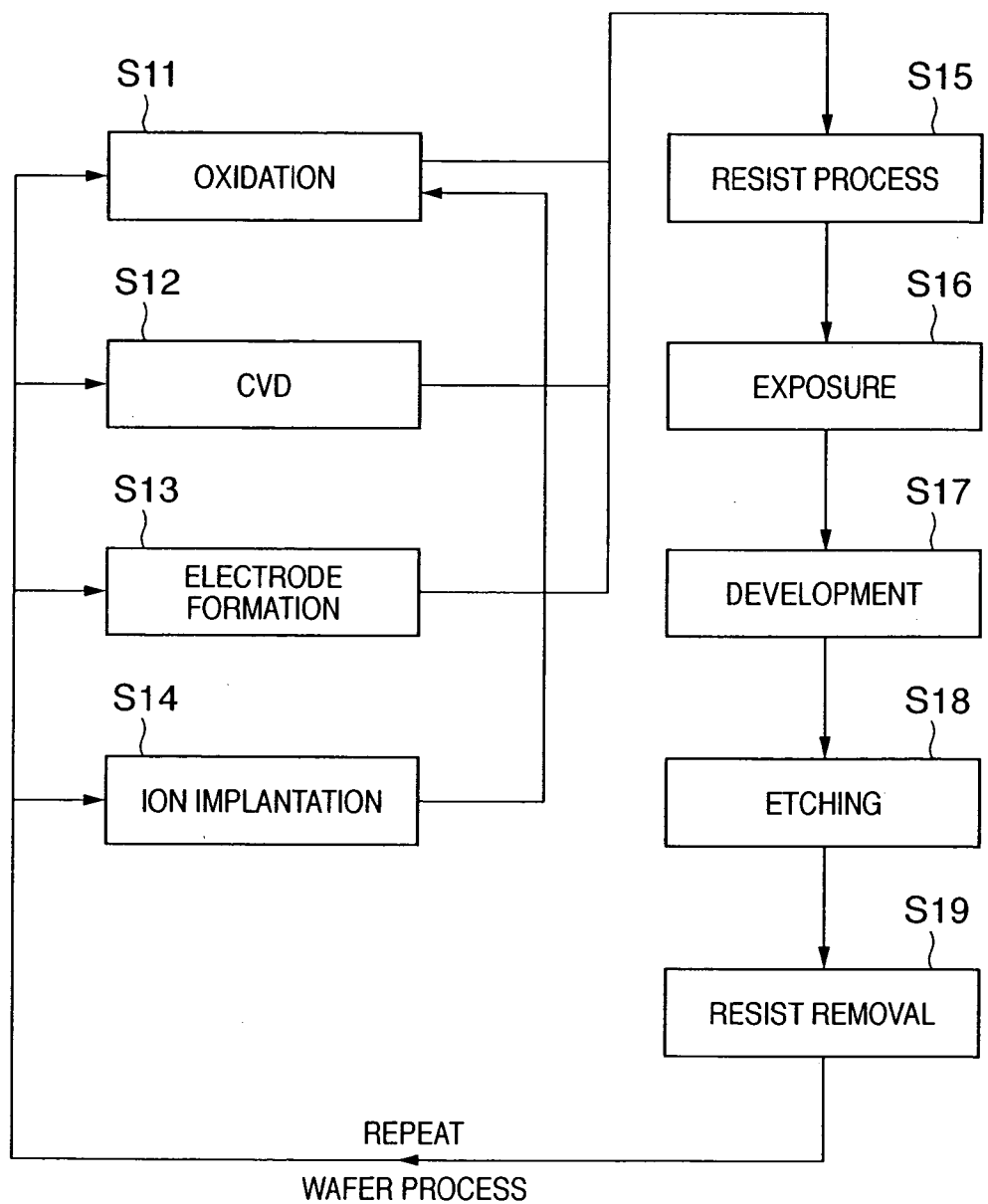

DRIVING APPARATUS AND EXPOSURE APPARATUS

FIELD OF THE INVENTION

The present invention relates to a driving apparatus which drives an object and an exposure apparatus which has a built-in driving apparatus.

BACKGROUND OF THE INVENTION

FIGS. 6 and 7 are views showing the schematic structure of a stage device built into an exposure apparatus. FIG. 7 shows an A-A section of FIG. 6. A substrate 101 on which a pattern is to be transferred or drawn is held on a substrate chuck (not shown) mounted on a stage 102. The stage 102 is arranged on a stage transport table 103 through stage guides 106 and driven in the Y direction. The stage guides 106 can include mechanical guide mechanisms or static pressure guides. The stage transport table 103 is supported on a stage unit table 105 by three or more support mechanisms 104 so that the influence of deformation of the stage unit table 105 will not be transmitted to the stage transport table 103.

An example of an electromagnetic actuator which drives the stage 102 includes various types, e.g., a type having an iron core at the center of a coil which generates a magnetic field, a Lorentz linear motor, which uses a core-less coil, and the like. In the example shown in FIGS. 6 and 7, a square annular linear motor, which is a Lorentz type linear motor and has a high motor efficiency, is employed.

The electromagnetic actuator is constituted by a stator obtained by winding a coil 108 around a stator support 107, and a movable element which includes magnets 109. When a current is supplied to the coil 108 of the stator with an appropriate phase, the Lorentz force acts on the magnets 109 to generate a thrust in the movable element. The movable element is connected to the stage 102 through a beam 110 and moves together with the stage 102. The stator has at least one coolant channel 111. Joule heat generated by the coil 108 is recovered by a coolant flowing in the coolant channel 111.

A stator outer box 112 is arranged outside the stator to prevent the heat generated by the coil 108 from adversely affecting the peripheral environment. The stator can be supported at its two ends by, e.g., support mechanisms 114. When the stator is to be used as a passive counter mass which moves while canceling a reaction force generated during stage driving, the support mechanisms 114 support the stator such that when the stage 102 moves, the stator can move in the opposite direction.

As shown in FIGS. 6 and 7, in order to allow the movable element to move in the Y direction together with the stage 102, the stator outer box 112 has a slit (opening) 113 which serves as a path of the beam 110 which connects the movable element and stage 102. The slit 113 has a length corresponding to the drive stroke of the stage 102.

As described above, the stator outer box 112 is provided to prevent the heat generated by the coil 108 from being transferred to the peripheral environment. If, however, the slit 113 is arranged at that portion of the constituent portion of the stator outer box 112 which faces the stage 102, the heat generated by the coil 108 adversely affects the temperature distribution in the space (stage space), where the stage 102 is arranged, through the slit 113.

Usually, the light path of a laser interferometer to measure the position of the stage 102 is arranged in the stage space.

Temperature fluctuation in the optical path of the laser interferometer decreases the position measurement accuracy of the stage 102 to decrease the positioning accuracy of the stage 102, and the like, thus decreasing the stability of the stage 102. Although a structure on the stage 102 serving as the measurement target of the laser interferometer has a small thermal expansion coefficient, it can deform on the order of nanometers due to a small temperature change. This can also decrease the positioning accuracy of the stage 102, thus decreasing the position reproducibility and overlapping accuracy of a pattern to be formed on the substrate 101.

To prevent heat transfer to the stage space, gas around the coil 108 as the heat portion of the linear motor may be exhausted forcedly. However, the exhaust flow is disordered by the movement of the movable element, and the heat generated by the coil 108 cannot be completely prevented from flowing into the stage space. With this structure, the flow rate necessary for exhaust is very large. This poses a large load to the environment maintaining unit of the exposure apparatus and can lead to an increase in apparatus cost.

In an exposure apparatus, e.g., an EUV (Extreme Ultra Violet) exposure apparatus, which performs exposure in a vacuum or a reduced pressure environment, even if the exposure apparatus is free from the influence of a heat transfer fluid, the influence of radiant heat transfer from the stator coil to the stage space becomes an issue.

SUMMARY OF THE INVENTION

The present invention has been made based on the recognition of the above problems, and has as its object to suppress heat transfer from, e.g., an electromagnetic actuator, to an object which is driven by the electromagnetic actuator.

A driving apparatus according to the present invention is formed as a driving apparatus that drives an object. The driving apparatus comprises an electromagnetic actuator having a movable element and a stator, a surrounding member surrounding a heat portion of the electromagnetic actuator, a beam which provides the object with a driving force in accordance with movement of the movable element, and a connecting member connecting the movable element and the beam. The surrounding member has an opening allowing the movement of the movable element. The opening is arranged at a portion of the surrounding member not facing the object.

According to a preferred embodiment of the present invention, for example, the opening can be arranged at a portion of the surrounding member, which is an opposite side of the object side. Alternatively, the opening may be arranged at least in one of lower and upper portions of the surrounding member.

According to another preferred embodiment of the present invention, the driving apparatus preferably further comprises a heat recovery unit at a position facing the opening.

According to still another preferred embodiment of the present invention, the movable element can be arranged to surround the stator, and the surrounding member can be arranged to surround the stator.

According to still another preferred embodiment of the present invention, a position where the electromagnetic actuator applies a thrust to the connecting member and a barycentral position of the object substantially coincide with each other.

According to still another preferred embodiment of the present invention, the object can include a stage.

An exposure apparatus according to the present invention is formed as an exposure apparatus that transfers or draws a pattern onto a substrate, and comprises the driving apparatus described above as an apparatus which drives the substrate.

An exposure apparatus according to another aspect of the present invention is an exposure apparatus which transfers a pattern of an original onto a substrate, which comprises the driving apparatus described above as an apparatus which drives the substrate or original.

A device manufacturing method according to the present invention includes a step of exposing a substrate coated with a photosensitive agent by using the exposure apparatus described above, and a step of developing the substrate.

According to the present invention, for example, heat transfer from an electromagnetic actuator to an object driven by the electromagnetic actuator can be suppressed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a view showing the schematic structure of the stage device which is built into the exposure apparatus to exemplify the problems of the present invention;

FIG. 9 is a flowchart showing a device manufacturing method; and

FIG. 10 is a flowchart showing a wafer process.

DETAILED DESCRIPTION OF THE PREFERRED EMBODIMENTS

The preferred embodiments of the present invention will be described with reference to the accompanying drawings.

Figure 1A:
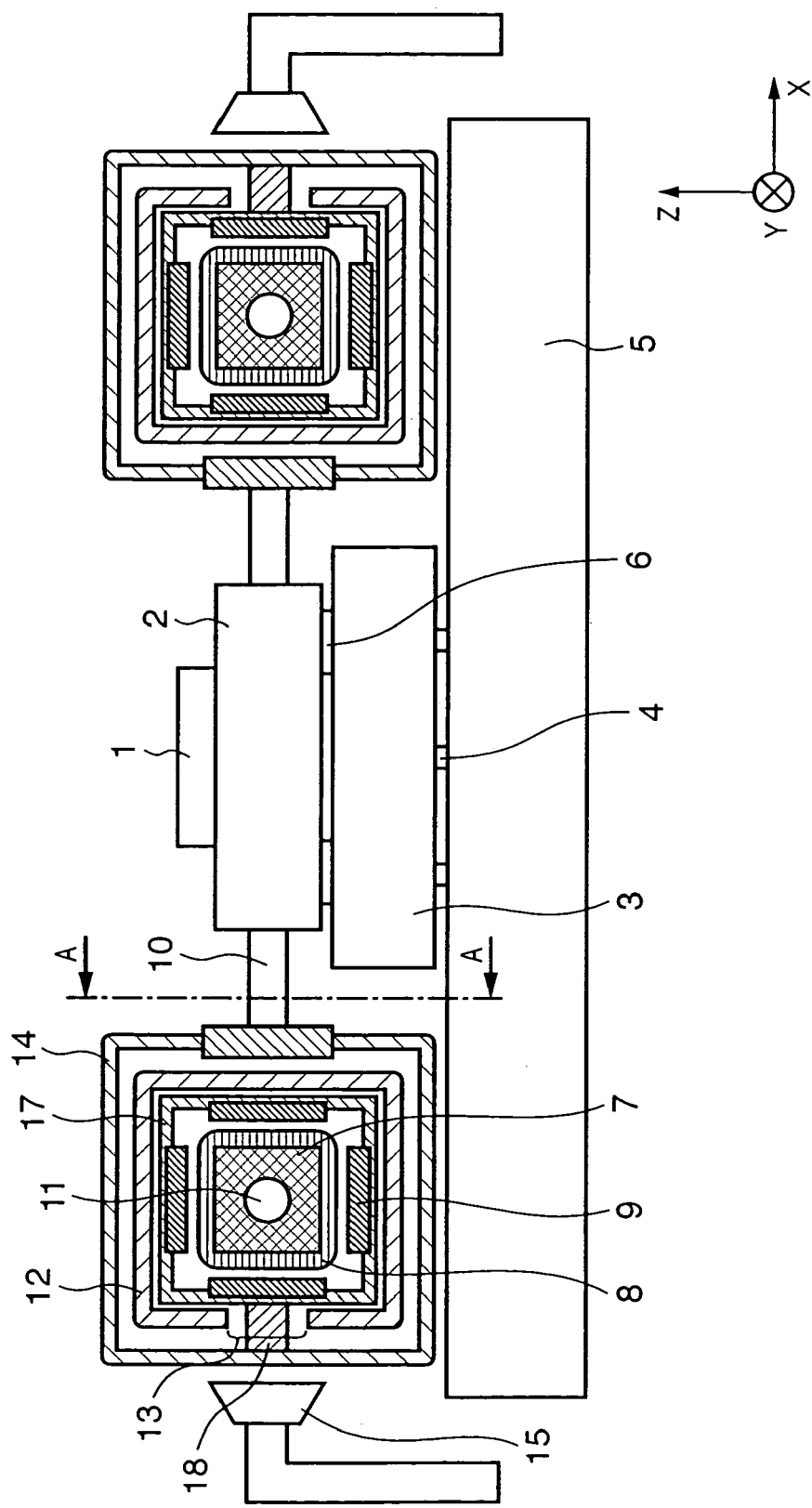
FIGS. 1A and 1B are views showing the schematic structure of a stage device according to the first embodiment of the present invention which can be built into an exposure apparatus.
Figure 1B:
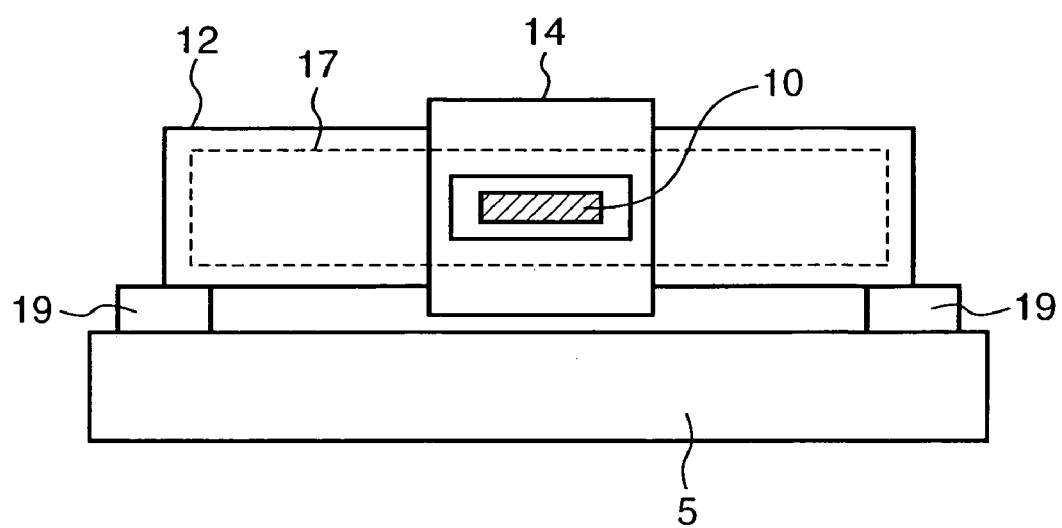

FIGS. 1A and 1B are views showing the schematic structure of a stage device (driving apparatus) according to the first embodiment of the present invention, which can be built into an exposure apparatus. FIG. 1B shows the A-A section of FIG. 1A. In the example shown in FIGS. 1A and 1B, the stage device is formed as a substrate stage device which positions a substrate. If a stage 2 and a structure that supports it are formed such that a pattern formed on an original (reticle) supported by the stage 2 is projected onto an exposure target substrate such as a wafer, the stage device can also be applied to an original stage device.

A substrate 1 on which a pattern is to be transferred or drawn is held on a substrate chuck (not shown) mounted on a stage (an example of an object driven by an electromagnetic actuator) 2. The stage 2 is arranged on a stage transport table 3 through stage guides 6 and driven in a predetermined direction (Y direction). The stage guides 6 can include mechanical guide mechanisms or static pressure guides. The stage transport table 3 is supported on a stage unit table 5 by three or more support mechanisms 4, so the influence of deformation of the stage unit table 5 will not be transmitted to the stage transport table 3.

An example of the electromagnetic actuator which drives the stage 2 includes various types, e.g., a type having an iron core at the center of a coil which generates a magnetic field, a Lorentz linear motor which uses a core-less coil, and the like. In the example shown in FIGS. 1A and 1B, a square annular linear motor, which is a Lorentz type linear motor and has a high motor efficiency, is employed.

The actuator includes a stator obtained by winding a coil 8 around a stator support 7, and a movable element which includes magnets 9. When a current is supplied to the coil 8 of the stator with an appropriate phase, the Lorentz force acts on the magnets 9 to generate a thrust in the movable element. The movable element is connected to the stage 2 through a beam 10 and moves together with the stage 2. Alternatively, the stage 2 may be formed such that it can move in the Y direction as the beam 10 moves and can slide in the X direction with respect to the beam 10. The stage 2 may be driven in the X direction by an X direction driving electromagnetic actuator (typically, a linear motor). In this case, the stage 2 serves as an X-Y stage, which is driven in the X-Y direction.

The stator has at least one coolant channel 11. Joule heat generated by the coil 8 serving as a heat portion is recovered by a coolant flowing in the coolant channel 11. A stator outer box (surrounding member) 12 is arranged outside the stator to surround it, and prevents the heat generated by the coil 8 from adversely affecting the peripheral environment (including the stage space). A temperature adjusting channel may be formed in the upper or lower surface of the stator outer box 12 or in the stator outer box 12 and a coolant may be supplied to the channel to temperature adjust the stator outer box 12. Alternatively, the upper or lower surface of the stator outer box 12 may be coated with a material having a low heat conductivity to suppress heat transfer from the coil 8 to the peripheral environment (including the stage space). The stator outer box 12 can be supported at its two ends by, e.g., support mechanisms 19.

A support 17 which supports the magnets 9 of the movable element is connected to the beam 10 by connecting members 18 and 14. The movable element transmits a driving force to the stage 2 in the Y direction through the beam 10. The connecting member 18 is connected to the connecting member 14 through a slit (opening) 13 in the stator outer box (surrounding member) 12, and can move as the movable element moves. The slit 13 in the stator outer box 12 is arranged at a portion that does not face the stage space (space where the stage 2 is arranged), in this case, at a portion which is opposite to the stage space. Thus, heat generated by the coil 8 is prevented from being transferred to the stage space through the slit 13.

With this structure, the position where the electromagnetic actuator supplies a thrust to the connecting member 18 can be easily set to substantially coincide with the barycentral position of a moving portion including the stage 2. This prevents a rotational component from being generated when the stage 2 is driven. The connecting member 14 can be formed to surround, e.g., the stator outer box 12.

A heat recovery unit 15 is preferably arranged at a portion that faces the slit 13 of the stator outer box 12. Then, the influence of heat radiated from the coil 8 through the slit 13 and transferred to the peripheral environment can be decreased.

When the stage device is used in a vacuum atmosphere, as the heat portion of the electromagnetic actuator is completely concealed from the stage space, the influence of direct radiant heat transfer can be shielded completely.

Figure 2:
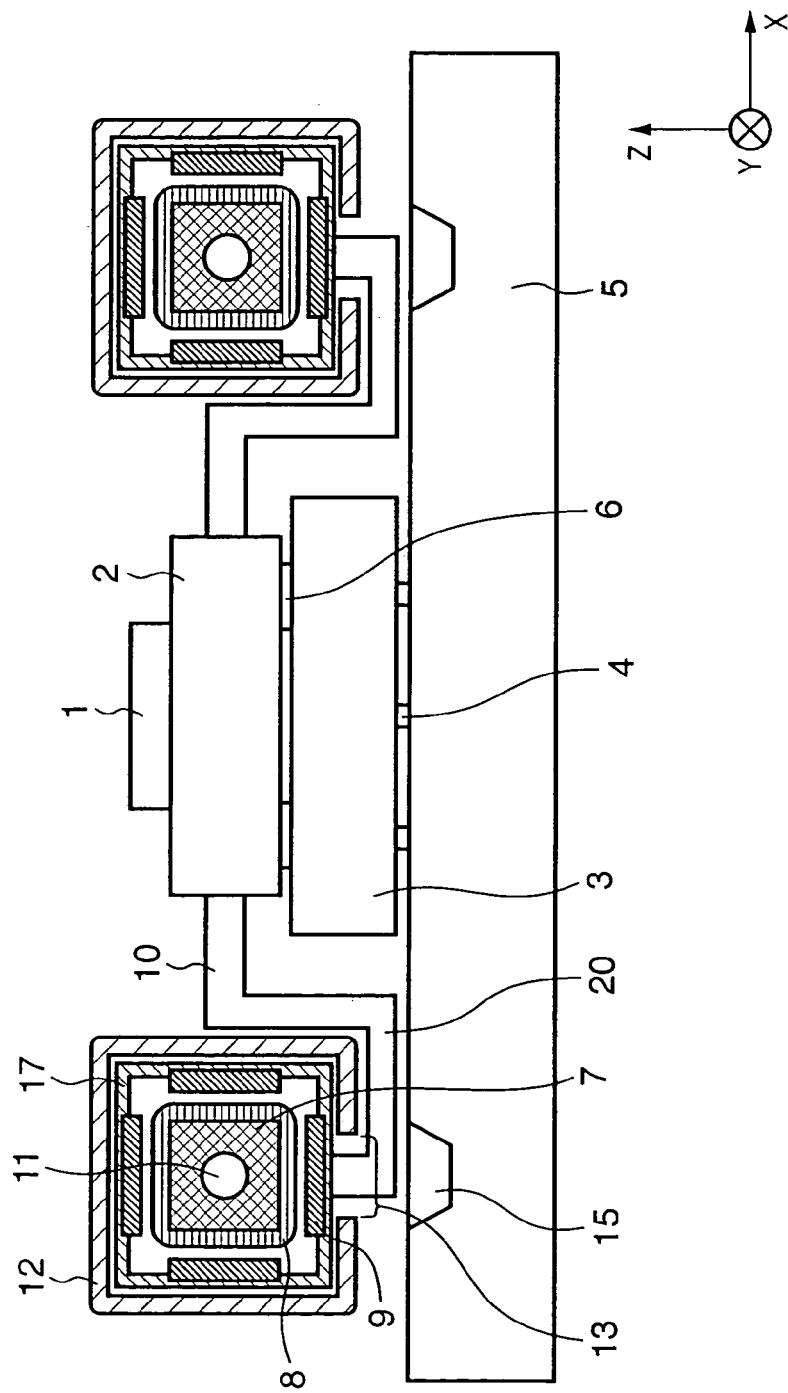
FIG. 2 is a view showing the schematic structure of a stage device according to the second embodiment of the present invention which can be built into an exposure apparatus.

FIG. 2 is a view showing the schematic structure of a stage device (driving apparatus) according to the second embodiment of the present invention, which can be built into an exposure apparatus. The same constituent elements as those in FIGS. 1A and 1B are denoted by the same reference numerals. Matters that are not particularly referred to can follow the first embodiment.

In the embodiment shown in FIG. 2, a slit (opening) 13 is formed in the lower portion of a stator outer box (surrounding member) 12. A support 17 which supports magnets 9 is connected to a beam 10 through a connecting member 20 connected under the support 17. In place of this structure, the slit 13 may be formed in the upper portion of the stator outer box 12. In the second embodiment as well, the slit 13 is arranged at that portion of the stator outer box 12 which does not face the stage space. In the structure in which the slit 13 is formed in the lower or upper portion of the stator outer box 12, the connecting member that connects the support 17 of the movable element and the beam 10 can be made smaller than in the structure shown in FIGS. 1A and 1B. Thus, the mass of the entire moving portion including the movable element, beam 10, stage 2, and the like, can be decreased.

A heat recovery unit 15 is preferably arranged at a portion that faces the slit 13 of the stator outer box 12. Then, the influence of heat radiated from a coil 8 and transferred to the peripheral environment through the slit 13 can be decreased.

Figure 3:
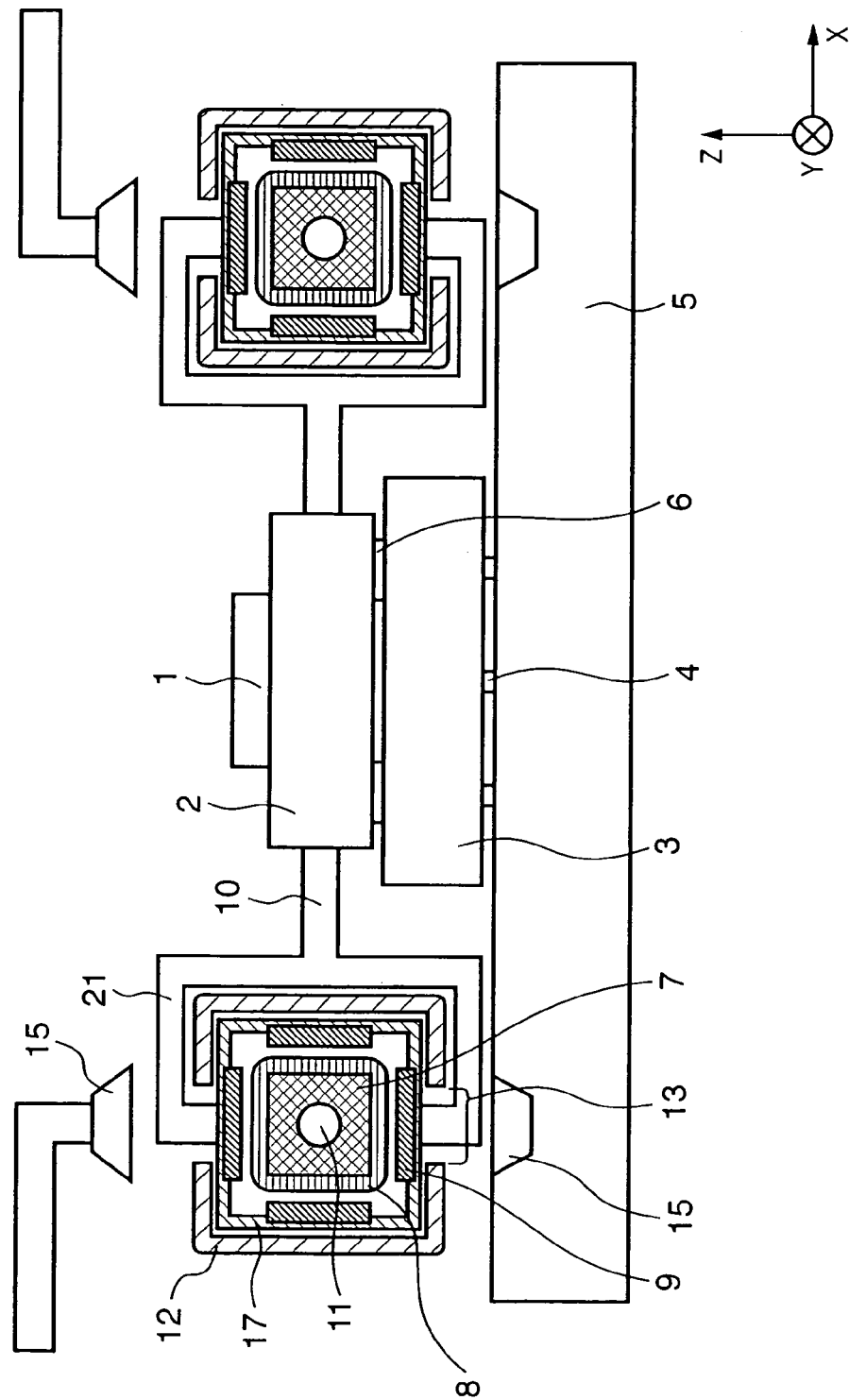
FIG. 3 is a view showing the schematic structure of a stage device according to the third embodiment of the present invention which can be built into an exposure apparatus.

FIG. 3 is a view showing the schematic structure of a stage device (driving apparatus) according to the third embodiment of the present invention, which can be built into an exposure apparatus. The same constituent elements as those in FIGS. 1A, 1B, and 2 are denoted by the same reference numerals. Matters that are not particularly referred to can follow the first and second embodiments.

In the embodiment shown in FIG. 3, slits (openings) 13 are formed in the lower and upper portions, respectively, of a stator outer box (surrounding member) 12. A support 17 which supports magnets 9 is connected to a beam 10 through connecting members 21 connected under the support 17 and to the upper portion of the support 17. In this structure as well, the slits 13 are arranged at those portions of the stator outer box 12 which do not face the stage space. According to this embodiment, the rigidity of the moving portion, particularly of portions that connect the support 17 and beam 10, can be increased to be higher than that in the second embodiment. The support 17 and beam 10 may be connected to each other at three or more portions.

Heat recovery units 15 are preferably arranged at portions that face the slits 13 of the stator outer box 12. Then, the influence of heat radiated from a coil 8 and transferred to the peripheral environment through the slits 13 can be decreased.

Figure 4:
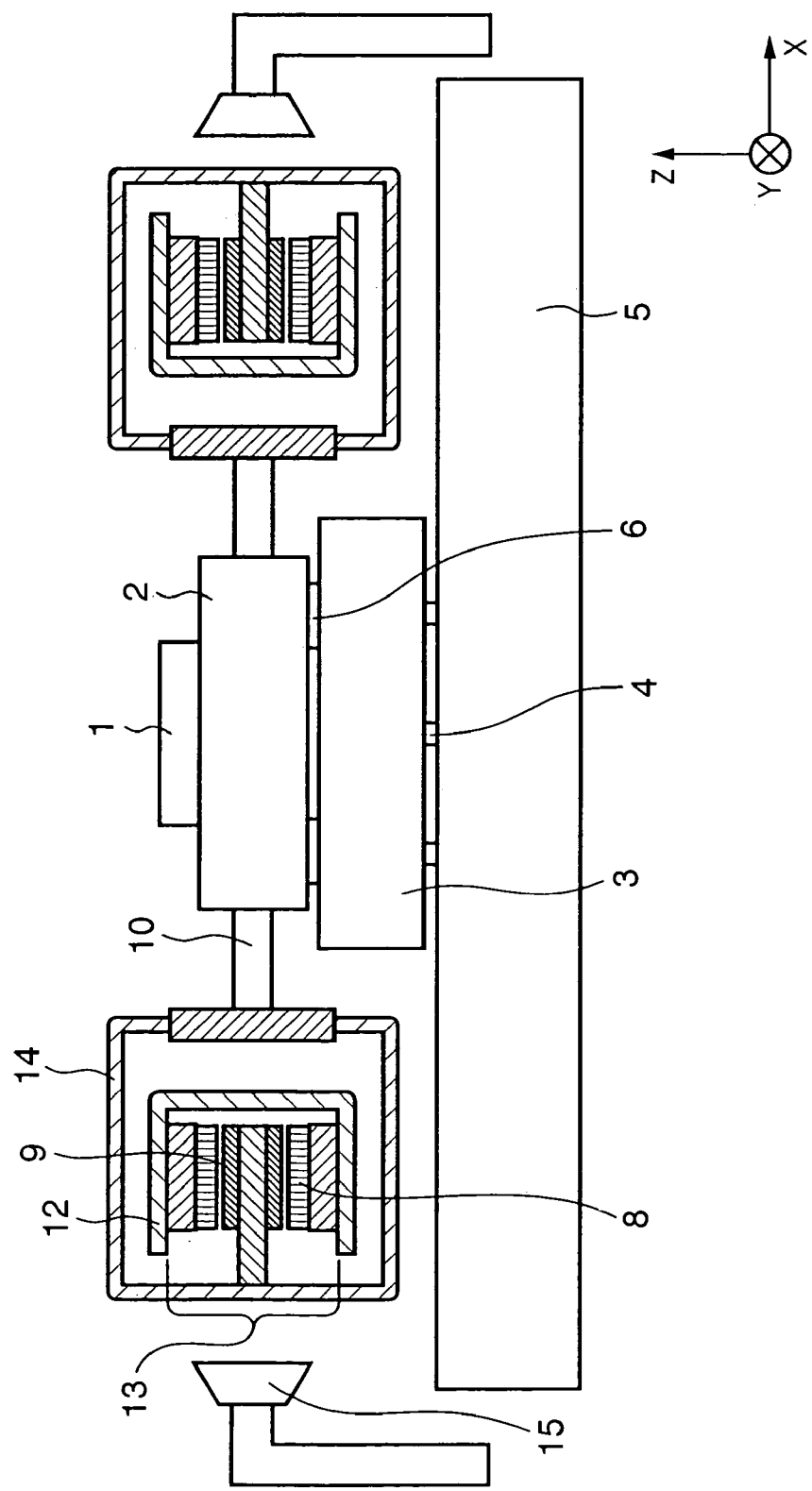
FIG. 4 is a view showing the schematic structure of a stage device according to the fourth embodiment of the present invention which can be built into an exposure apparatus.

FIG. 4 is a view showing the schematic structure of a stage device (driving apparatus) according to the fourth embodiment of the present invention which can be built into an exposure apparatus. The same constituent elements as those in FIGS. 1A, 1B, 2, and 3 are denoted by the same reference numerals. Matters that are not particularly referred to can follow the first, second, and third embodiments.

In the fourth embodiment, as an electromagnetic actuator, a Lorentz back yoke type linear motor in which coils 9 are arranged in a planar manner is employed. In this structure, a slit (opening) 13 is formed in a stator outer box (surrounding member) 12 which surrounds and supports a coil 8 serving as a heat portion. The slit 13 is arranged at a portion that does not face the stage space, in this case, at a portion opposite to the stage space.

A heat recovery unit 15 is preferably arranged at a portion that faces the slit 13 of the stator outer box 12. Then, the influence of heat radiated from the coil 8 and transferred to the peripheral environment through the slit 13 can be decreased.

Although the stator and stator outer box are substantially square in each of the first to fourth embodiments, they can be changed to have other polygonal shapes, or circular or elliptical shapes. Note that the structure that has the best area efficiency when mounted on a stage device is a square.

Figure 5:
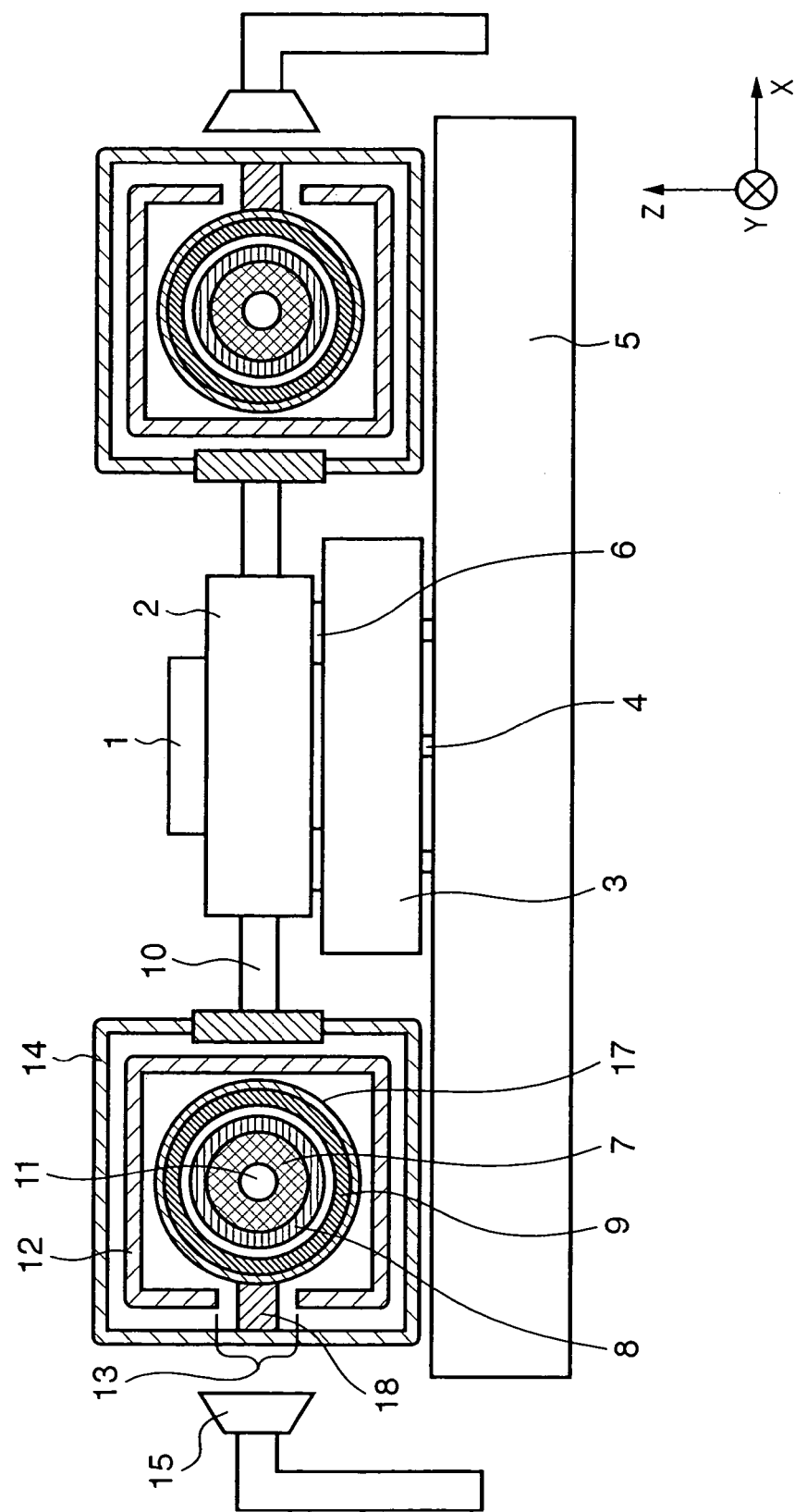
FIG. 5 is a view showing the schematic structure of a stage device according to the fifth embodiment of the present invention which can be built into an exposure apparatus.
Figure 6:
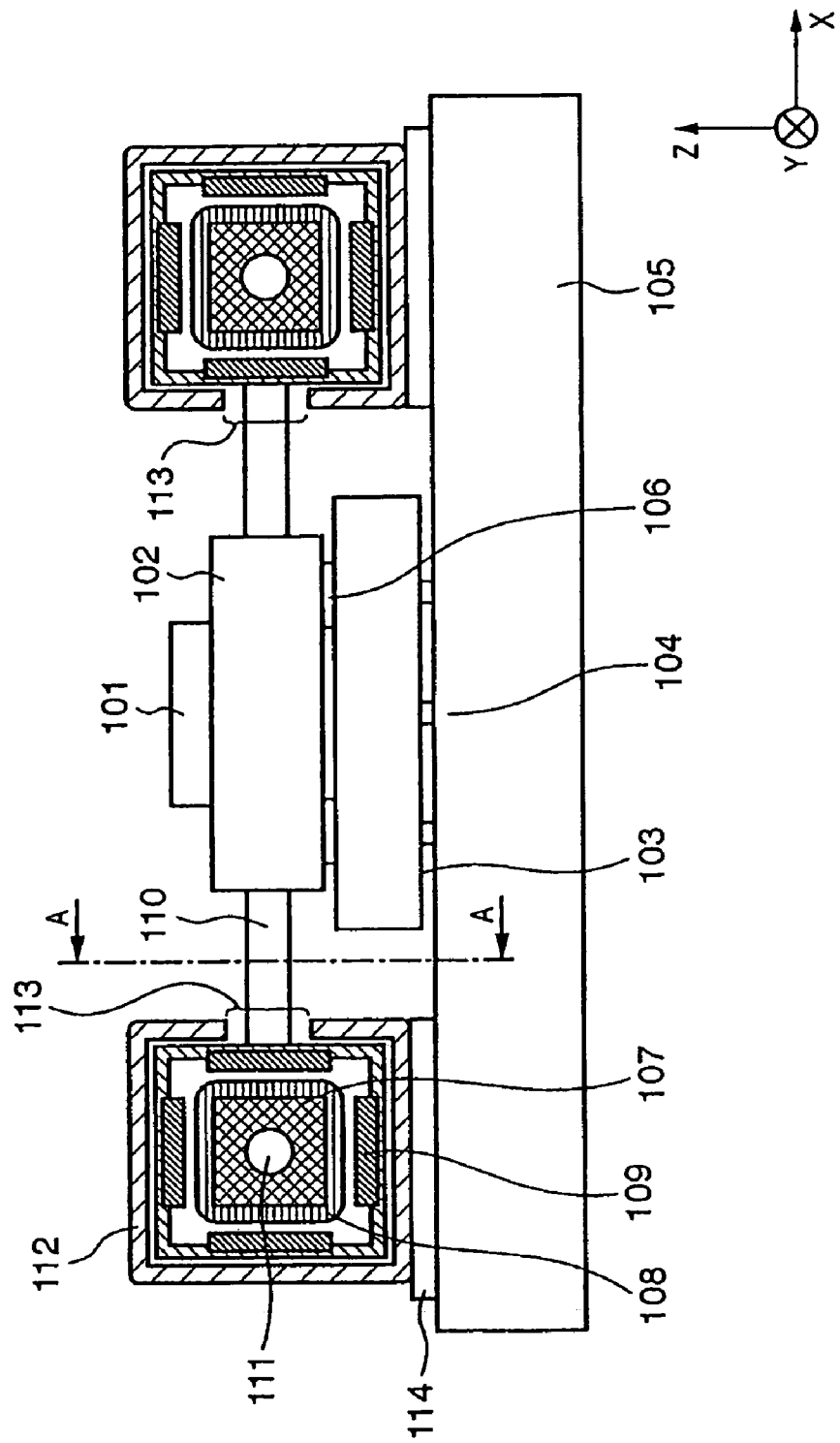
FIG. 6 is a view showing the schematic structure of a stage device which is built into an exposure apparatus to exemplify the problems of the present invention.

FIG. 5 is a view showing the schematic structure of a stage device (driving apparatus) according to the fifth embodiment of the present invention, which can be built into an exposure apparatus. The same constituent elements as those in FIGS. 1A, 1B, 2, 3, and 4 are denoted by the same reference numerals. Matters that are not particularly referred to can follow the first, second, third, and fourth embodiments.

In the fifth embodiment, as an electromagnetic actuator, a cylindrical linear motor having a motor efficiency which is equivalent to that of a prismatic linear motor is employed. In this structure as well, a slit (opening) 13 of a stator outer box (surrounding member) 12 is arranged at a portion that does not face the stage space, in this case, a portion opposite to the stage space.

A heat recovery unit 15 is preferably arranged at a portion that faces the slit 13 of the stator outer box 12. Then, the influence of heat radiated from the coil 8 and transferred to the peripheral environment through the slit 13 can be decreased.

Figure 8:
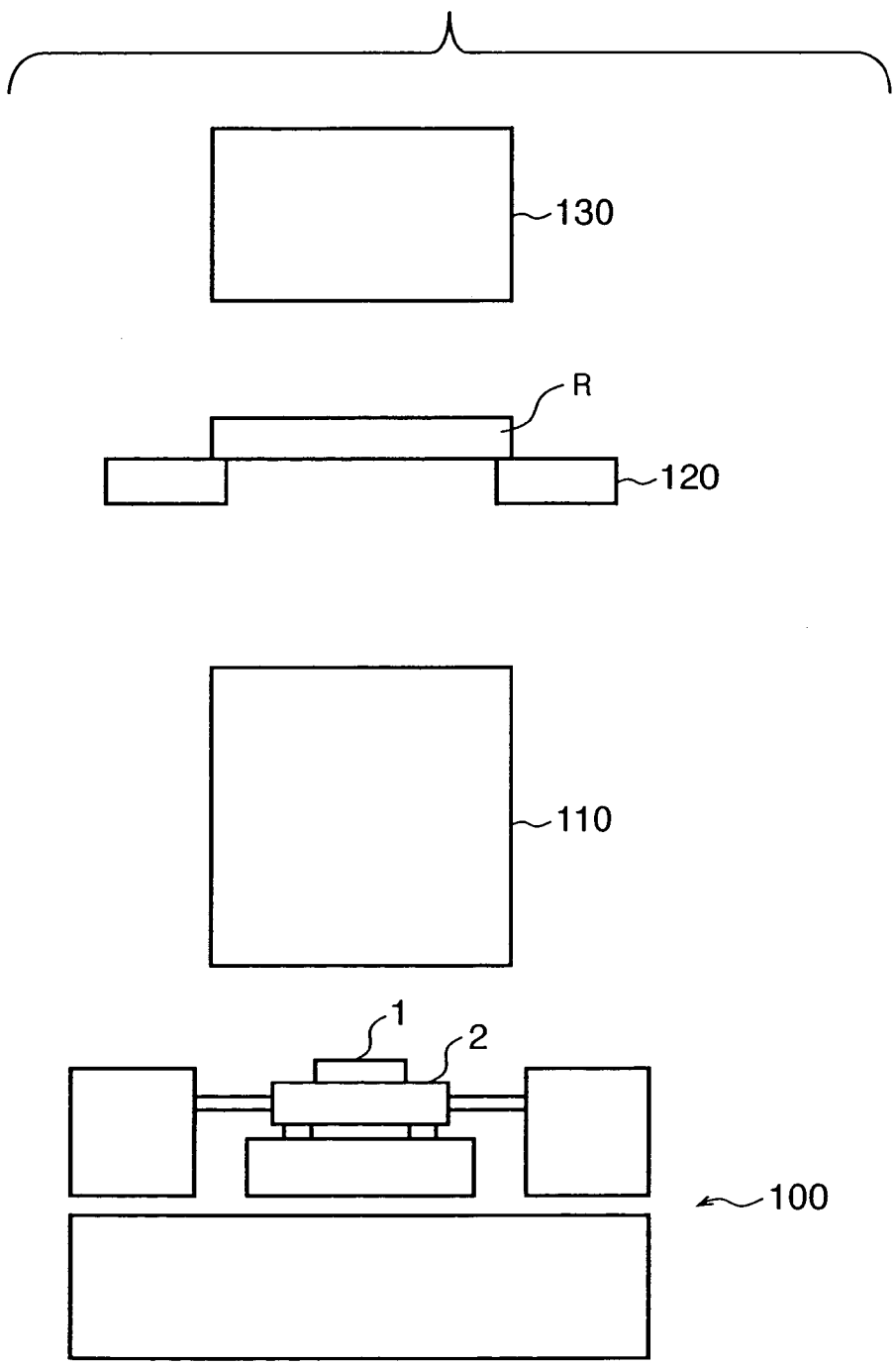
FIG. 8 is a view showing the schematic structure of an exposure apparatus.

FIG. 8 is a view showing the schematic arrangement of an exposure apparatus into which a stage device (driving apparatus) typically described as the embodiments shown in FIGS. 1A, 1B, and 2 to 5 is built as a substrate stage device. Typically, a substrate stage device 100 includes, in addition to an electromagnetic actuator which drives a stage 2 in the Y direction as described above, an electromagnetic actuator which drives the stage 2 in the X direction. Typically, in the substrate stage device, the stage 2 is driven by a fine movement stage device which can be controlled in six axes. The fine movement stage device is driven by an X-Y direction driving electromagnetic actuator as described above.

An original R held by an original stage device 120 is illuminated by an illumination optical system 130. The pattern of the original R is projected and transferred onto a substrate 1 on the stage 2 through an optical system 110. For example, the exposure apparatus can be formed as a stepper, scanner, or another apparatus. The exposure apparatus can be formed to draw a pattern on the substrate 1 with a charged particle beam such as an electron beam.

The stage device typically described as the embodiments shown in FIGS. 1A and 1B, and 2 to 5 can also be formed as an original stage device 120 which moves an original R. In this case, a stage 2 and a structure that supports it can be formed such that a pattern formed on the original R is projected onto a wafer substrate.

As a device manufacturing process, which uses this exposure apparatus, a semiconductor device manufacturing process will be exemplified. FIG. 9 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the exposure apparatus described above in accordance with lithography using the mask and wafer described above. In the next step 5 (assembly), called a post-process, a semiconductor chip is formed from the wafer fabricated in step 4. This step includes processes such as assembly (dicing and bonding) and packaging (chip encapsulation). In step 6 (inspection), inspections, such as an operation check test and a durability test of the semiconductor device fabricated in step 5, are performed. A semiconductor device is finished with these steps and shipped in step 7.

The wafer process of step 4 has the following steps (FIG. 10), i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004 073403 filed on Mar. 15, 2004, the entire contents of which are hereby incorporated by reference herein.

What is claimed is:

1. A driving apparatus which drives an object, the apparatus comprising:
    an electromagnetic actuator having a movable element and a stator;
    a surrounding member surrounding a heat portion of the electromagnetic actuator;
    a beam which provides the object with a driving force in accordance with movement of the movable element;
    a connecting member connecting the movable element and the beam, wherein the surrounding member has an opening allowing the movement of the movable element, the opening being arranged at a portion of the surrounding member not facing the object; and
    a heat recovery unit arranged at a position facing the opening.

2. The apparatus according to claim 1, wherein the opening is arranged at a portion of the surrounding member, which is an opposite side of the object side.

3. The apparatus according to claim 1, wherein the opening is arranged at least in one of lower and upper portions of the surrounding member.

4. The apparatus according to claim 1, wherein the movable element is arranged to surround the stator, and the surrounding member is arranged to surround the movable element such that the heat portion of the electromagnetic actuator is covered.

5. The apparatus according to claim 1, wherein a position where the electromagnetic actuator applies a thrust to the connecting member substantially coincides with a barycentral position of the object.

6. The apparatus according to claim 1, wherein the object includes a stage.

7. An exposure apparatus which transfers or draws a pattern on a substrate, said apparatus comprising:
    a driving apparatus according to claim 1 as an apparatus that drives the substrate.

8. An exposure apparatus which transfers a pattern of an original onto a substrate, said apparatus comprising:
    a driving apparatus according to claim 1 as an apparatus that drives one of the substrate and the original.

9. A device manufacturing method which comprises:
    a step of exposing a substrate coated with a photosensitive agent by using an exposure apparatus according to claim 7, and
    a step of developing the substrate.

10. A device manufacturing method which comprises:
    a step of exposing a substrate coated with a photosensitive agent by using an exposure apparatus according to claim 8, and
    a step of developing the substrate.

11. A driving apparatus which drives an object, the apparatus comprising:
    an electromagnetic actuator having a movable element and a stator, the movable element being arranged to surround the stator;
    a surrounding member surrounding the movable element such that a heat portion of the electromagnetic actuator is covered;
    a beam which provides the object with a driving force in accordance with movement of the movable element; and
    a connecting member connecting the movable element and the beam, and surrounding the surrounding member,
    wherein the surrounding member has an opening allowing the movement of the movable element, the opening being arranged at a portion of the surrounding member not facing the object.

* * * * *

UNITED STATES PATENT AND TRADEMARK OFFICE
CERTIFICATE OF CORRECTION

PATENT NO. : 7,239,051 B2
APPLICATION NO. : 11/074710
DATED : July 3, 2007
INVENTOR(S) : Hideo Tanaka Page 1 of 1

It is certified that error appears in the above-identified patent and that said Letters Patent is hereby corrected as shown below:

ON THE TITLE PAGE:
In item "(75) Inventor:," Hideo Tanaka, Ustunomiya (JP)" should read -- Hideo Tanaka, Utsunomiya (JP) --.

Signed and Sealed this

Eighteenth Day of March, 2008

JON W. DUDAS
*Director of the United States Patent and Trademark Office*